(12) United States Patent
Park

(10) Patent No.: US 12,154,640 B2
(45) Date of Patent: Nov. 26, 2024

(54) PREDETERMINED PATTERN PROGRAM OPERATIONS

(71) Applicant: Micron Technology, Inc., Boise, ID (US)

(72) Inventor: Kitae Park, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/856,827

(22) Filed: Jul. 1, 2022

(65) Prior Publication Data

US 2024/0006007 A1    Jan. 4, 2024

(51) Int. Cl.
*G11C 29/10* (2006.01)
*G06F 3/06* (2006.01)
*G11C 16/16* (2006.01)
*G11C 16/34* (2006.01)
*G11C 29/52* (2006.01)

(52) U.S. Cl.
CPC ............ *G11C 29/10* (2013.01); *G06F 3/0619* (2013.01); *G06F 3/0632* (2013.01); *G06F 3/0673* (2013.01); *G11C 16/16* (2013.01); *G11C 16/3418* (2013.01); *G11C 16/3431* (2013.01); *G11C 29/52* (2013.01)

(58) Field of Classification Search
CPC ..... G11C 16/3418; G11C 29/52; G11C 16/16; G11C 16/3431; G11C 29/10; G06F 3/0619; G06F 3/0632; G06F 3/0673
See application file for complete search history.

(56) References Cited

U.S. PATENT DOCUMENTS

| | | | |
|---|---|---|---|
| 2012/0198292 A1* | 8/2012 | Yuzurihara | G11C 29/56 714/E11.159 |
| 2015/0187439 A1* | 7/2015 | Querbach | G06F 11/263 714/719 |
| 2017/0116075 A1* | 4/2017 | Yang | G06F 11/1068 |
| 2021/0335434 A1 | 10/2021 | Jung et al. | |
| 2021/0383870 A1 | 12/2021 | Tseng et al. | |
| 2021/0398602 A1 | 12/2021 | Lakshminarayana et al. | |
| 2022/0108749 A1 | 4/2022 | Joe | |
| 2022/0115074 A1* | 4/2022 | Teoh | G11C 16/26 |

* cited by examiner

*Primary Examiner* — Cynthia Britt
*Assistant Examiner* — Sazzad Hossain
(74) *Attorney, Agent, or Firm* — Brooks, Cameron & Huebsch, PLLC

(57) ABSTRACT

Apparatuses, systems, and methods for predetermined pattern program operations are described according to embodiments of the present disclosure. One example method can include determining a portion of a memory device is invalid and performing a predetermined pattern program operation on the portion of the memory device in response to determining the portion of the memory device is invalid.

17 Claims, 4 Drawing Sheets

PREDETERMINED PATTERN PROGRAM OPERATIONS

TECHNICAL FIELD

The present disclosure relates generally to printed circuit board assemblies, and more particularly, to apparatuses and methods for performing predetermined pattern program operations.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

DETAILED DESCRIPTION

Figure 1:
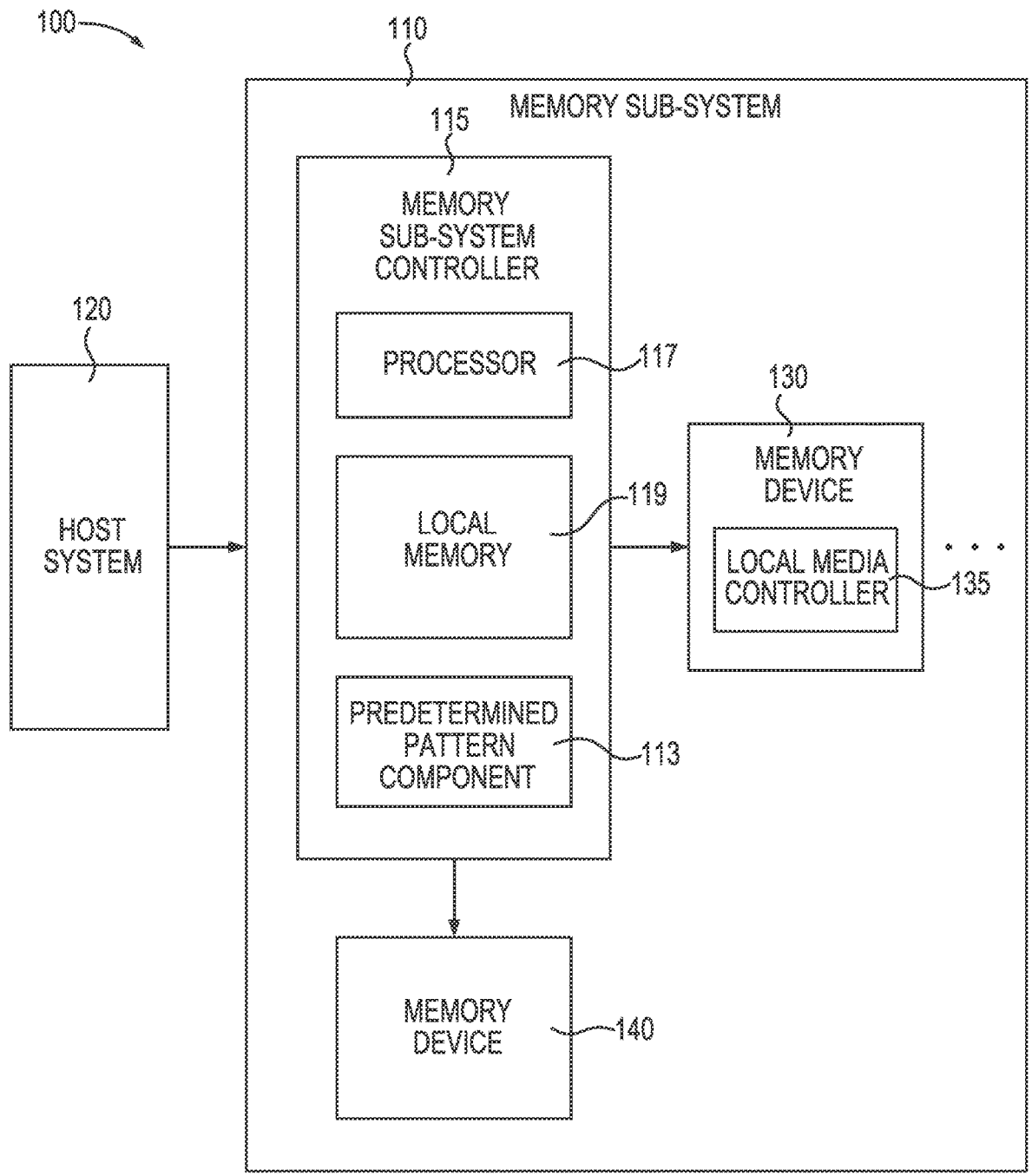
FIG. 1 illustrates an example computing system that includes a memory sub-system in accordance with some embodiments of the present disclosure.

Aspects of the present disclosure are directed to predetermined pattern program operations in a memory subsystem. The predetermined pattern can be used to program memory cell in a memory sub-system to a predetermined pattern that can reduce threshold voltage shift in memory cells and/or to increase a read window budget for memory cells. The predetermined pattern program operations can be performed during processing stages of a memory sub-system and/or while the memory sub-system is being used (e.g., user data is being written to and/or read from the memory sub-system). The predetermined patter program operation can program memory cells with any pattern. The pattern can be a pattern to reduce threshold voltage shift caused by transitions between states when programming or erasing memory cells.

A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates.

During the life of a memory device, and, particularly during the life of a memory device that utilizes non-volatile memory technology, the memory cells of the memory device can experience threshold voltage shift. The threshold voltage shift can be dependent on the workload of the memory device and/or environmental conditions of the memory device. For example, the ability of the memory cells to retain data accurately and/or provide accurate data in response to receipt of a memory access request can decrease over time. Stated alternatively, NAND memory cells can generally only sustain a finite quantity of erase cycles before the memory cells begin to fail to accurately retain data and/or become unusable.

In order to mitigate the effects of these properties of non-volatile memory cells, various techniques are employed, generally through the use of a controller such as a non-volatile memory controller. Examples of the techniques commonly utilized to mitigate the adverse effects experienced by such memory cells as a result of the memory cells being erased include wear leveling, block consolidation, and/or minimization of data migration in the memory device, among others. Although such techniques can alleviate some of the issues that can arise in a memory device as a result of the memory cells being repeatedly erased, they generally do not account for hole/electron redistribution and transportation effects on memory cells as memory cells are repeatedly programmed and erased.

For example, as described in more detail herein, embodiments of the present disclosure perform predetermined pattern program operations to program memory cells to a predetermined pattern. Once the memory cell is programmed to the predetermined pattern and then programmed with user data, the predetermined pattern to which the memory cells were programed prior to being programmed with user data can reduce threshold voltage shift in the memory cells and therefore increase a read window budget (RWB) associated with the memory cells.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a predetermined pattern component 113. Although not shown in FIG. 1 so as to not obfuscate the drawings, the predetermined pattern component 113 can include various circuitry to facilitate performance of predetermined pattern program operations to determine a program memory cells, memory devices, and/or portions of memory devices with predetermined patterns. The predetermined pattern component 113 can perform predetermined pattern program operations. As described herein, the predetermined program operations can be performed on memory devices at any time during processing stages or during user operation. The predetermined pattern component 113 may be referred to herein in the alternative as a "controller," a "processing device," or a "processor," given the context of the disclosure.

Although the predetermined pattern component 113 is illustrated as being resident on the memory sub-system controller 115, embodiments are not so limited. For example, the predetermined pattern component 113 can be resident on the memory device 130 (e.g., resident on the local media controller), or can be resident on other components of the memory sub-system 110. As used herein, the term "resident on" refers to something that is physically located on a particular component. For example, the predetermined pattern component 113 being "resident on" the memory sub-system controller 115 refers to a condition in which the hardware circuitry that comprises the predetermined pattern component 113 is physically located on the memory sub-system controller 115. The term "resident on" can be used interchangeably with other terms such as "deployed on" or "located on," herein.

In some embodiments, the memory sub-system controller 115 includes at least a portion of the predetermined pattern component 113. For example, the memory sub-system controller 115 can include a processor 117 (processing device) configured to execute instructions stored in local memory 119 for performing the operations described herein. In some embodiments, predetermined pattern component 113 is part of the host system 110, an application, or an operating system.

In some embodiments, the memory sub-system 110, and hence the predetermined pattern component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

FIGS. 2A-2E illustrate example memory device processing stages with predetermined pattern program operations in accordance with some embodiments of the present disclosure. Predetermined pattern program operations can be performed during and/or after processing stages of a memory device. Some processing stages of memory devices can leave portions of the memory devices in states that are either erased or programmed with test data. The memory cells that are programmed with test data can be programmed with predetermined pattern program operations during or after a processing stage. The predetermined pattern program operations can be performed to an entire memory device and/or to portions of the memory device while the processing stage is being performed. The predetermined pattern program operations can be performed to an entire memory device and/or to portions of the memory device after completion of a processing stage and before beginning a next processing stage.

Figure 2A:
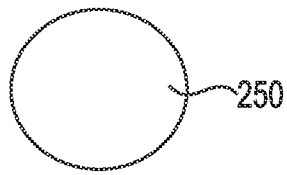
FIGS. 2A-2E illustrate example memory device stages with predetermined pattern program operations in accordance with some embodiments of the present disclosure.

FIG. 2A illustrates predetermined pattern program operations performed in association with a wafer test processing stage 250. Predetermined pattern program operations can be performed during the wafer test processing stage on a portion of the memory device and/or the entire memory device. Predetermined pattern program operations can be performed on portions of the memory device that were programmed with test data during wafer test and/or the entire memory device upon completion of wafer test and prior to beginning the system assembly processing stage.

Figure 2B:
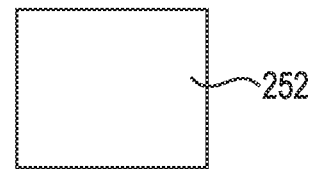

FIG. 2B illustrates predetermined pattern program operations performed in association with a system assembly processing stage 252. Predetermined pattern program operations can be performed during the system assembly processing stage on a portion of the memory device and/or the entire memory device. Predetermined pattern program operations can be performed on portions of the memory device that were programmed with test data during system assembly and/or the entire memory device upon completion of system assembly and prior to beginning the system test processing stage.

Figure 2C:
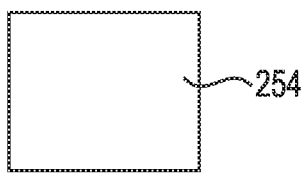

FIG. 2C illustrates predetermined pattern program operations performed in association with a system test processing stage 254. Predetermined pattern program operations can be performed during the system test processing stage on a portion of the memory device and/or the entire memory device. Predetermined pattern program operations can be performed on portions of the memory device that were programmed with test data during system test and/or the entire memory device upon completion of system test and prior to beginning the activation processing stage.

Figure 2D:
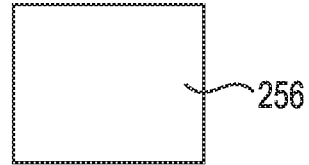

FIG. 2D illustrates predetermined pattern program operations performed in association with an activation processing stage 256. Predetermined pattern program operations can be performed during the activation processing stage on a portion of the memory device and/or the entire memory device. Predetermined pattern program operations can be performed on portions of the memory device that were programmed with test data during activation and/or the entire memory device upon completion of system assembly and prior to beginning user usage of the memory device.

Figure 2E:
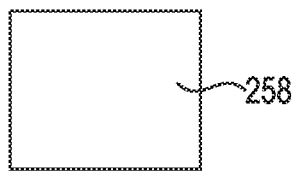

FIG. 2E illustrates predetermined pattern program operations performed in association with user usage 258 of the memory device. Predetermined pattern program operations can be performed while programming user data on the memory device. Predetermined pattern program operations can be at any time, in response to a portion the data on the memory device being invalid, and/or prior to an erase operation.

Figure 3:
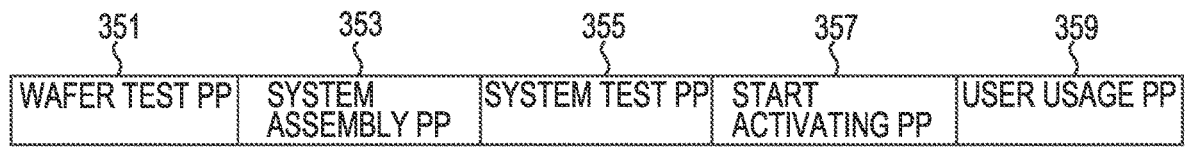
FIG. 3 illustrates a number of predetermined pattern program operations in accordance with some embodiments of the present disclosure.

FIG. 3 illustrates a number of predetermined pattern program operations in accordance with some embodiments of the present disclosure. FIG. 3 includes wafer test predetermined program operations 351, system assembly predetermined program operations 353, system test predetermined program operations 355, activation predetermined program operations 357, and user usage predetermined program operations 359.

Wafer test predetermined program operations 351 can program the entire or portions of the memory device with predetermined patterns during or after wafer test. During wafer test the memory device does not include user data, therefore the wafter test predetermined program operations can be applied without regard to the status of the memory device.

System assembly predetermined program operations 353 can program the entire or portions of the memory device with predetermined patterns during or after system assembly. During system assembly the memory device does not include user data, therefore the system assembly predetermined program operations can be applied without regard to the status of the memory device.

System test predetermined program operations 355 can program the entire or portions of the memory device with predetermined patterns during or after system test. During wafer test the memory device does not include user data, therefore the system test predetermined program operations can be applied without regard to the status of the memory device.

Activation predetermined program operations 357 can program portions of the memory device with predetermined patterns during activation of the memory device. During activation of the memory device, portions of the memory device can include user data, therefore the activation predetermined program operations can be applied prior to erasing portions of the memory device and/or prior to programming portions of the memory device.

User usage predetermined program operations 359 can program portions of the memory device with predetermined patterns during user usage of the memory device (e.g., when data is being programmed, read, and/or erased on the memory device). During user usage of the memory device, portions of the memory device can include user data, therefore the user usage predetermined program operations can be applied prior to erasing portions of the memory device and/or prior to programming portions of the memory device.

Figure 4:
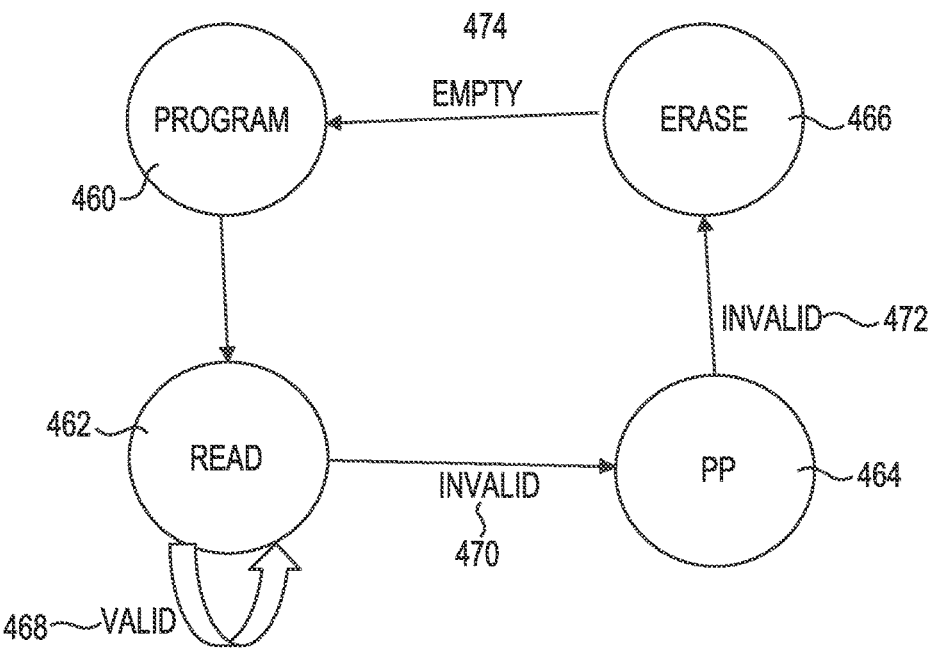
FIG. 4 illustrates a method for performing predetermined pattern program operations in accordance with a number of embodiments of the present disclosure.

FIG. 4 illustrates a method for performing predetermined pattern program operations in accordance with a number of embodiments of the present disclosure. A number of portions of the memory device can be programmed 460. In response the number of portions of the memory device being programmed, the number of portions of the memory device can be read 462. The number of portions of the memory device can continue to be read as long as the number of portions of the memory device are determined to be valid 468.

In response to determining one or more portions of the number of portions of the memory device are invalid 470, the one or more portions of the memory device can be programmed with a predetermined pattern 464. Once the one or more portions of the memory device are programmed with the predetermined pattern, the one or more portions of the memory device remain invalid 472 (e.g., the one or more portions of the memory device do not include data that can be read). In response to programming the one more portions of the memory device with the predetermined patter, the one or more portions of the memory device can be erased 466. Once the one or more portions of the memory device are erased, the one more portions of the memory device are empty 474 and are ready to be programmed 460 and read 462.

Figure 5A:
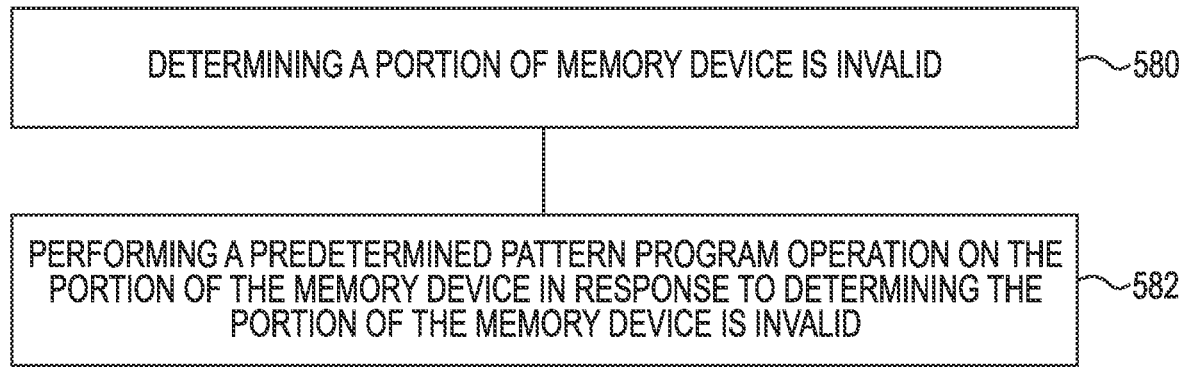
FIG. 5A is a method flow diagram illustrating an example predetermined pattern program operation in accordance with a number of embodiments of the present disclosure.

FIG. 5A is a method flow diagram illustrating an example predetermined pattern program operation in accordance with a number of embodiments of the present disclosure. At 580, the method includes determining a portion of a memory device is invalid. At 582, the method includes performing a predetermined pattern program operation on the portion of the memory device in response to determining the portion of the memory device is invalid. The predetermined pattern program operation can program the portion of the memory device to a predetermined program state.

The method can include erasing the portion of the memory device in response to performing the predetermined pattern program operation on the portion of the memory device and include performing the predetermined pattern program operation prior to erasing the portion of the memory device.

In a number of embodiments, performing the predetermined pattern program operation can reduce threshold voltage shift in the portion of the memory device after erasing the portion of the memory device and programming the portion of the memory device with user data. Also, performing the predetermined pattern program operation can increase a read window budget (RWB) in the portion of the memory device after erasing the portion of the memory device and programming the portion of the memory device with user data.

The predetermined pattern program that is used to during the predetermined pattern program operation can be based on a workload of the portion of the memory device and/or the environmental conditions of the memory device.

Figure 5B:
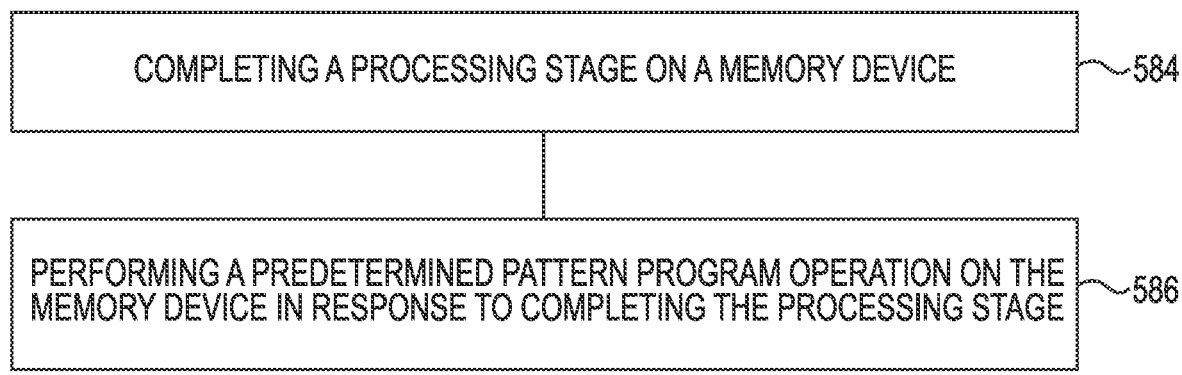
FIG. 5B is a method flow diagram illustrating an example predetermined pattern program operation in accordance with a number of embodiments of the present disclosure

FIG. 5B is a method flow diagram illustrating an example predetermined pattern program operation in accordance with a number of embodiments of the present disclosure. At 584, the method can include completing a processing stage on a memory device. At 586, the method can include performing a predetermined pattern program operation on the memory device in response to completing the processing stage. The method can include performing the predetermined pattern programming operation on non-erased portions of the memory device.

In a number of embodiments, the processing stage can be a wafter test stage and the predetermined pattern program operation can be a wafer test predetermined pattern program operation. The processing stage can be a system assembly stage and the predetermined pattern program operation can be a system assembly predetermined pattern program operation. The processing stage can be a system test stage and the predetermined pattern program operation can be a system test predetermined pattern program operation. The processing stage can be an activation stage and the predetermined pattern program operation can be an activating predetermined pattern program operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    completing a first processing stage on a memory device from a plurality of processing stages, wherein the plurality of processing stages utilize corresponding predetermined pattern program operations;
    determining a first portion of memory cells of the memory device are invalid from the first processing stage;
    starting a second processing stage;
    programing, during the second processing stage, a predetermined pattern on a second portion of memory cells of the memory device based on the second processing stage in response to determining the first portion of the memory cells are invalid and prior to erasing the first portion of memory cells of the memory device that are determined to be invalid from the first processing stage; and
    erasing, during the second processing stage, the predetermined pattern from the second portion of memory cells in response to programming the predetermined pattern on the second portion of memory cells.

2. The method of claim 1, wherein the first processing stage is one of: a wafer test stage; a system assembly stage; a system test stage; or an activation stage of the memory device.

3. The method of claim 1, wherein programming the predetermined pattern includes programming the second portion of the memory device to a predetermined program state.

4. The method of claim 1, wherein programming the predetermined pattern reduces threshold voltage shift in the first portion of the memory device after erasing the first portion of the memory device and programming the first portion of the memory device with user data.

5. The method of claim 1, wherein programming the predetermined pattern increases a read window budget (RWB) in the first portion of the memory device after erasing the second portion of the memory device and programming the first portion of the memory device with user data.

6. The method of claim 1, wherein the predetermined pattern is based on a workload of the first portion of the memory device.

7. The method of claim 1, wherein the predetermined pattern is based on environmental conditions of the memory device.

8. A method, comprising:
 completing a first processing stage on a memory device from a plurality of processing stages, wherein the plurality of processing stages utilize corresponding plurality of predetermined patterns;
 determining a first portion of memory cells of the memory device are invalid from the first processing stage;
 programming, during a second processing stage, a predetermined pattern on a second portion of memory cells from the plurality of the plurality of predetermined patterns on the memory device in response to completing the first processing stage of the memory device and prior to erasing the first portion of memory cells of the memory device that are determined to be invalid from the first processing stage, wherein the predetermined pattern is based on the processing stage of the memory device; and
 erasing, during the second processing stage, the predetermined pattern from the second portion of memory cells of the memory device in response to programming the predetermined pattern on the memory device.

9. The method of claim 8, wherein the first processing stage is a wafter test stage and the predetermined pattern is a wafer test predetermined pattern.

10. The method of claim 9, wherein the second processing stage is a system assembly stage and the predetermined pattern is a system assembly predetermined pattern.

11. The method of claim 8, wherein the first processing stage is a system test stage and the predetermined pattern is a system test predetermined pattern.

12. The method of claim 9, wherein the second processing stage is an activation stage and the predetermined pattern is an activating predetermined pattern.

13. The method of claim 8, further including programming the predetermined pattern on non-erased portions of the memory device.

14. An apparatus, comprising:
 a memory device; and
 a controller couplable to the memory device, wherein the controller is configured to:
 perform a first type of processing stage on the memory device from a plurality of types of processing stages;
 determine a first portion of memory cells of the memory device that are invalid from the first type of processing stage;
 perform a second type of processing stage on the memory device from the plurality of types of processing stages;
 program, during the second type of processing stage, a predetermined pattern to at least a second portion of the memory device to a predetermined program state based on the second type of the processing stage of completed on the memory device and prior to erasing the first portion of memory cells of the memory device that are determined to be invalid from the first processing stage; and
 erase, during the second type of processing stage, the predetermined pattern from the second portion of the memory device in response to programming the predetermined pattern to at least the second portion of the memory device.

15. The apparatus of claim 14, wherein programming the predetermined pattern is performed in response to the portion of the memory device being invalid.

16. The apparatus of claim 14, wherein the predetermined pattern is based on a workload of the memory device.

17. The apparatus of claim 14, wherein the predetermined pattern is based on environmental conditions of the memory device.

* * * * *